US007062743B2

(12) United States Patent
Kahng et al.

(10) Patent No.: US 7,062,743 B2
(45) Date of Patent: Jun. 13, 2006

(54) FLOORPLAN EVALUATION, GLOBAL ROUTING, AND BUFFER INSERTION FOR INTEGRATED CIRCUITS

(75) Inventors: Andrew B. Kahng, Del Mar, CA (US); Christoph Albrecht, Berkeley, CA (US); Ion I. Mandoiu, Storrs, CT (US); Alexander Z. Zelikovsky, Roswell, GA (US)

(73) Assignee: The Regents of the University of California, Oakland, CA (US)

( * ) Notice: Subject to any disclaimer, the term of this patent is extended or adjusted under 35 U.S.C. 154(b) by 191 days.

(21) Appl. No.: 10/670,134

(22) Filed: Sep. 24, 2003

(65) Prior Publication Data

US 2004/0117753 A1 Jun. 17, 2004

Related U.S. Application Data

(60) Provisional application No. 60/413,096, filed on Sep. 24, 2002.

(51) Int. Cl.
*G06F 17/50* (2006.01)

(52) U.S. Cl. .......................................... 716/13; 716/12
(58) Field of Classification Search .............. 716/7–14
See application file for complete search history.

(56) References Cited

U.S. PATENT DOCUMENTS 6,480,991 B1 * 11/2002 Cho et al. ..................... 716/8

6,883,154 B1 * 4/2005 Teig et al. ..................... 716/7
2004/0044979 A1 * 3/2004 Aji et al. ...................... 716/13

OTHER PUBLICATIONS

Albrecht, C. et al..; Floorplan evaluation with timing-driven global wireplanning, pin assignment, and buffer/wire sizing, Design Automation Conference, 7th Asia and South Pacific. Jan. 7-11, 2002 pp.:580-587.*
Albrecht, "Global Routing by New Approximation Algorithms for Multicommodity Flow", IEEE Transactions on Computer-Aided Design of Integrated Circuits and Systems, vol. 20(5), May 2001, pp. 622-632.
Alpert et al., "A practical methodology for early buffer and wire resource allocation", Proc. DAC, 2001, pp. 189-194.
Alpert et al., "A practical methodology for early buffer and wire resource allocation", IEEE Transactions on Computer-Aided Design of Integrated Circuits and Systems, vol. 22(5), 2003, pp. 573-583.

(Continued)

*Primary Examiner*—Stacy A. Whitmore
*Assistant Examiner*—Naum Levin
(74) *Attorney, Agent, or Firm*—Greer, Burns & Crain, Ltd.

(57) ABSTRACT

A method and system for evaluating a floorplan and for defining a global buffered routing for an integrated circuit including constructing a graphical representation of the integrated circuit floorplan, including wire capacity and buffer capacity; formulating an integer linear program from said graphical representation; finding a solution to said integer linear program.

24 Claims, 9 Drawing Sheets

OTHER PUBLICATIONS

Alpert et al., "Minimum buffered routing with bounded capacitive load for slew rate and reliability control", IEEE Transactions on Computer-Aided Design of Integrated Circuits and Systems, vol. 22, No. 3, Mar. 2003, pp. 241-253.

Alpert et al., "Is wire tapering worthwhile?", Proc. ICCAD, 1999, pp. 430-435.

Carden et al., "A global router using an efficient approximate multicommodity multiterminal flow algorithm", Proc. DAC, 1991, pp. 316-321.

Carden et al., "A Global Router with a Theoretical Bound on the Optimum Solution", IEEE Transactions on Computer-Aided Design of Integrated Circuits and Systems, 1996, pp. 208-216.

Chen et al., "The Berkeley building-block (BBL) layout system for VLSI design", VLSI 83, Proceedings of the IFIP TC WG 10.5 International Conference on Very Large Scale Integration, Trondheim, Aug. 1983, pp. 37-44.

Chen et al., "BBL: A Building Block Layout System for Custom Chip Design", Proc. IEEE Int. Conf. on Computer-Aided Design, Sep. 1983, pp. 40-41.

Cong et al., "Performance optimization of VLSI interconnect layout", Integration 21 (1996), pp. 1-94.

Cong, "Pin Assignment with Global Routing for General Cell Design," IEEE Trans. on CAD 10(11) (1991), pp. 1401-1412.

Cong, et al., "Buffer block planning for interconnect-driven floorplanning", Proc. ICCAD, 1999, pp. 358-363.

Dai et al., "Simultaneous floor planning and global routing for hierarchical building-block layout", IEEE Trans. on CAD 6(5) (1987), pp. 828-837.

Dragan et al., "Practical approximation algorithms for separable packing linear programs", Proc. 7th Workshop on Algorithms and Datastructures (WADS), 2001, pp. 325-337.

Dragan et al., "Provably good global buffering by generalized multiterminal multicommodity flow approximation", IEEE Transactions on Computer-Aided Design, 21(3), Mar. 2002, pp. 263-274.

Dragan et al., "Provably good global buffering by multiterminal multicommodity flow approximation", Proc. ASP-DAC, 2001, pp. 120-125.

Dragan et al., "Provably good global buffering using an available buffer block plan", Proc. ICCAD, 2000, pp. 104-109.

Fleischer, "Approximating fractional multicommodity flow independent of the number of commodidies", Siam J. Discrete Math., 13(4), (2000), pp. 505-520.

Garg et al., "Faster and simpler algorithms for multicommodity flow and other fractional packaging problems", Proc. 39th Annual Symposium on Foundations on Computer Science, 1998, pp. 1-10.

Phillips, "The network inhibition problem", Proc. 25th Annual ACM Symposium on Theory of Computing, 1993, pp. 776-785.

Raghavan et al., "Randomized rounding: a technique for provably good algorithms and algorithmic proofs", Combinatorica, 7 (1987), pp. 365-374.

Tang et al., "Planning buffer locations by networks flows", Proc. ISPD, 2000, pp. 180-185.

* cited by examiner (1) Set $y_v := \frac{\delta}{\mu_0 b(v)} \forall v \in V(G)$, $z_e := \frac{\delta}{v_0 w(z)} \forall e \in E(G)$, $u := \frac{\delta}{D}$ (2) Set $x_p := 0 \ \forall p \in \mathcal{P}$ (3) Set $r = 0$ and $p_i := \emptyset$ for $i = 1, \ldots, k$.

(4) While $\mu_0 \sum_{v \in V(G)} b(v) y_v + v_0 \sum_{(u,v) \in E(G)} w(u,v) z_{u,v} + Du < 1$ do:

(5) begin (6) $r := r+1$.

(7) For $i := 1$ to $k$, do (8) begin (9) If $p_i = \emptyset$ or $\sum_{v \in V(G)} |p_i \cap E_v|(y_v + \alpha u) + \sum_{(u,v) \in E(G)} |p_i \cap E_{u,v}|(z_{u,v} + \beta u) > (1 + \gamma \epsilon) l_i$ then

(10) begin

(11) Find a path $p_i \in \mathcal{P}_i$ minimizing $l_i := \sum_{v \in V(G)} |p_i \cap E_v|(y_v + \alpha u) + \sum_{(u,v) \in E(G)} |p_i \cap E_{u,v}|(z_{u,v} + \beta u)$

(12) end

(13) Set $x_{p_i} := x_{p_i} + 1$

(14) Set $y_v := y_v \left(1 + \epsilon \frac{|p_i \cap E_v|}{\mu_0 b(v)}\right) \forall v \in V(G)$, $z_e := z_e \left(1 + \epsilon \frac{|p_i \cap E_{u,v}|}{v_0 w(u,v)}\right) \forall (u,v) \in E(G)$ $u := u \left(1 + \epsilon \frac{\alpha \sum_{v \in V(G)} |p_i \cap E_u| + \beta \sum_{(u,v) \in E(G)} |p_i \cap E_{u,v}|}{D}\right)$

(15) end

(16) end

(17) Output $(x_p/r)_{p \in \mathcal{P}}$

*FIG. 3*

(1) Set $w^* := \infty$
(2) For all $v \in V$ do    // try all possible Steiner points
(3) begin
(4)   For $j := 0$ to $U$
(5)   begin
(6)     Find a shortest $v^{U-j} - t_i^1$-path $P_1$ in $H$
(7)     For $k := 0$ to $U - j$
(8)     begin
(9)       Find a shortest $v^{U-k} - t_i^2$-path $P_2$ in $H$
(10)      Find a shortest $s_i^0 - v^{U-j-k}$-path $P_0$ in $H$
(11)      If $w(P_0) + w(P_1) + w(P_2) \leq w^*$ then
(12)        Set $w^* := w(P_0) + w(P_1) + w(P_2)$
              $T^* := P_0 \cup P_1 \cup P_2$
(13)    end
(14)   end
(15) end
(16) return $T^*$

FIG. 7

FLOORPLAN EVALUATION, GLOBAL ROUTING, AND BUFFER INSERTION FOR INTEGRATED CIRCUITS

REFERENCE TO RELATED APPLICATION AND PRIORITY CLAIM

This application is related to now abandoned provisional application Ser. No. 60/413,096, filed on Sep. 24, 2002, and claims priority from that provisional application under 35 U.S.C. § 119. Provisional application Ser. No. 60/413,096 is incorporated herein by reference in its entirety.

FIELD OF THE INVENTION

The present invention relates generally to the design and evaluation of integrated circuits ("ICs").

BACKGROUND OF THE INVENTION

Early planning of buffer and wiring resources is a critical aspect of every modern high-performance very large scale integration ("VLSI") implementation methodology. Today, such planning is needed to evaluate the quality of register transfer ("RT") level partitioning and soft (pre-synthesis) block placement/shaping, system-level timing constraints, and pin definition and buffered routing of global interconnects.

While the requirements for global wire planning as an adjunct to floorplan definition (i.e., the floorplan definition must take into account congestion, wire length, and timing, among other things) and the need for simultaneous pin assignment and global routing have not changed very much in the past ten to twenty years, it is well-understood that today's context for floorplan definition and global wire planning has evolved. Channel-less multilayer area routing has replaced channel/switchbox routing; interconnect delays are more balanced with appropriately sized gate delays, and no longer dominated by gate delays; layer RC constants vary by factors of up to 100, so that layer assignment must be planned; global interconnects are buffered; and floorplanning is at the RT-level (instead of physical floorplanning) with soft blocks having uncertain area/delay envelopes. At the same time, the underlying problem formulations and algorithmic technologies have separately advanced in at least three important ways: "buffer block" methodology, optimizations for individual global nets, and provably good global routing (i.e., global routing that reflects near-optimal solutions, or solutions with a proven approximation ratio, to problem formulations).

The "buffer block" methodology, along with the associated planning problem (i.e., solving for locations and capacities of buffer blocks), has been proposed and further elucidated. While the buffer block methodology has been used recently in hierarchical structured-custom (high-end microprocessor) methodologies, it may be less relevant to flat or application-specific integrated circuit, or "ASIC"—like regimes (where "ASIC" stands for "application-specific integrated circuit") due to issues of separate power distribution, congestion, etc. To alleviate congestion problems associated with the use of buffer blocks, a "buffer site" methodology has been proposed which more uniformly distributes buffers across the chip wherever possible. In the buffer site methodology, block designers leave "holes" in their designs that can be used to insert buffers during the routing of global wires. The percentage of the block area left unused depends on the criticality of the block, ranging from 0% for high performance blocks, such as caches, up to a few percent for lower performance blocks.

The increased impact of interconnects on system performance in deep-submicron technologies has led to a large amount of literature on performance-driven optimizations for individual global nets. Such optimizations include buffer insertion and sizing, wire sizing, and topology synthesis.

Provably good global routing has been developed based on the primal dual framework, starting with "column-generating" analogies, then continuing with the exploitation of recent fast approximations for multi-commodity flows. More recently such provable approximations have been applied to the problem of global routing with a prescribed buffer block plan, taking into account signal parity, delay upper/lower bounds, and other practical considerations.

SUMMARY OF THE INVENTION

The present invention includes a system and method for evaluating a floorplan and for defining a global buffered routing for an integrated circuit. A method embodiment of the invention includes constructing a graphical representation of the integrated circuit floorplan, including wire capacity and buffer capacity; formulating an integer linear program from said graphical representation; finding a solution to said integer linear program.

BRIEF DESCRIPTION OF THE DRAWINGS

FIG. 3 is an algorithm used in an embodiment of the present invention.

FIG. 7 is a subroutine algorithm used with the algorithm of FIG. 3 in an embodiment of the invention.

DETAILED DESCRIPTION

The present invention includes a method and system for evaluating IC wire routing and buffer resources and for constructing IC global buffered routings. The present invention may be used for IC floorplan evaluation, and for IC construction of global routing and buffer insertion for ICs. A method embodiment of the invention includes constructing a graphical representation of the integrated circuit floorplan, including wire capacity and buffer capacity; formulating an integer linear program from said graphical representation; finding a solution to said integer linear program. The present invention allows floorplan evaluation, global routing, and buffer insertion for ICs that takes into account effectively and simultaneously buffer and wire congestion, buffer and wire sizing, multiple global nets, pin assignments, and timing constraints. Such floorplan evaluation, global routing, and buffer insertion are desirable in order to reduce the design time and improve the performance of complex, large-scale ICs.

Figure 1:
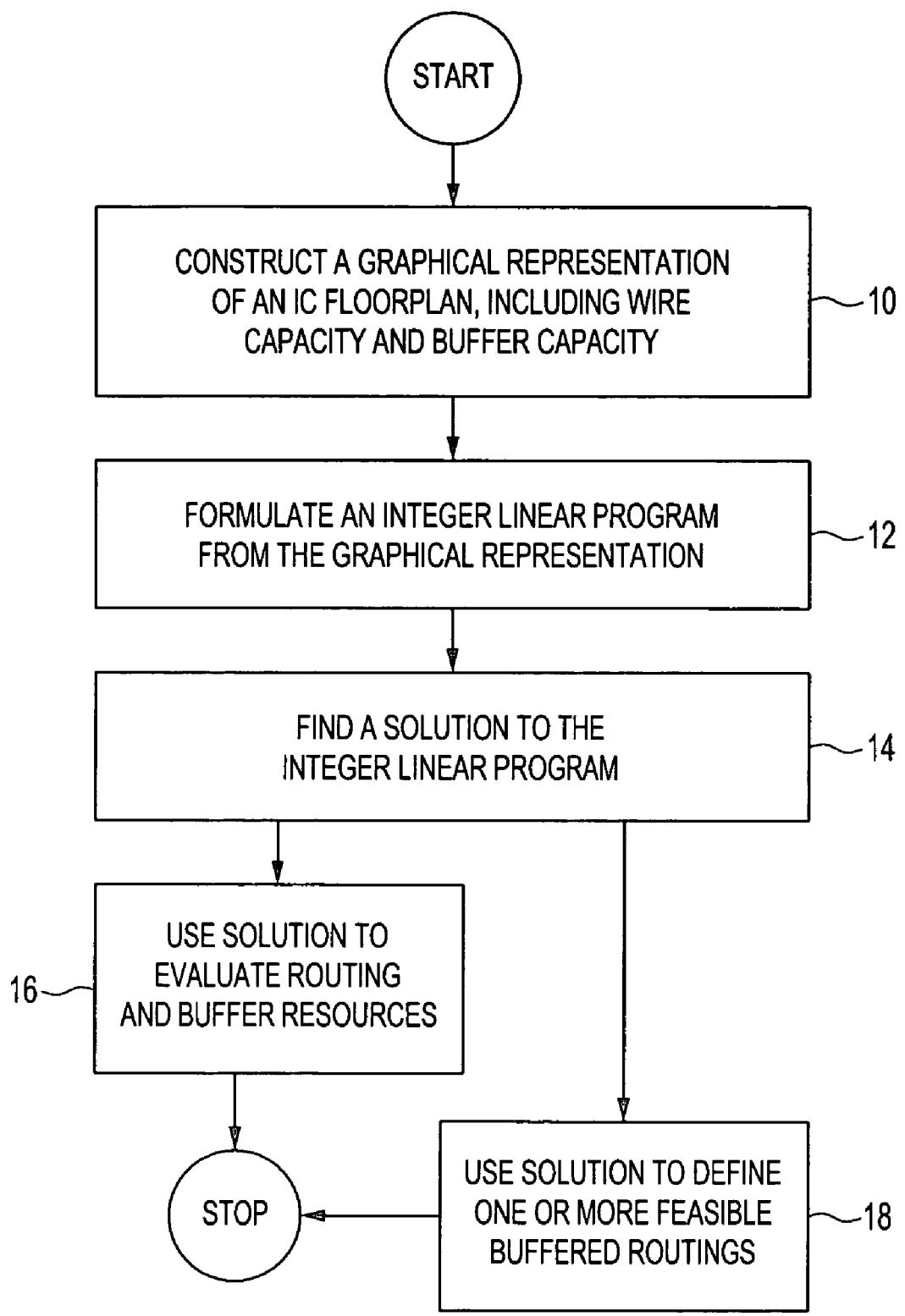
FIG. 1 is a flowchart showing embodiments of the invention.

FIG. 1 is a flowchart showing preferred embodiment methods of the invention. A graphical representation of the floorplan, including wire capacity and buffer capacity, is constructed (step 10). An integer linear program from the graphical representation is then formulated (step 12). A solution to the integer linear program is found (step 14). In one embodiment of the invention, the solution found in step 14 is used to evaluate routing and buffer resources (step 16). In another embodiment of the invention, the solution found in step 14 is used to define one or more feasible buffered routings (step 18).

Figure 2A:
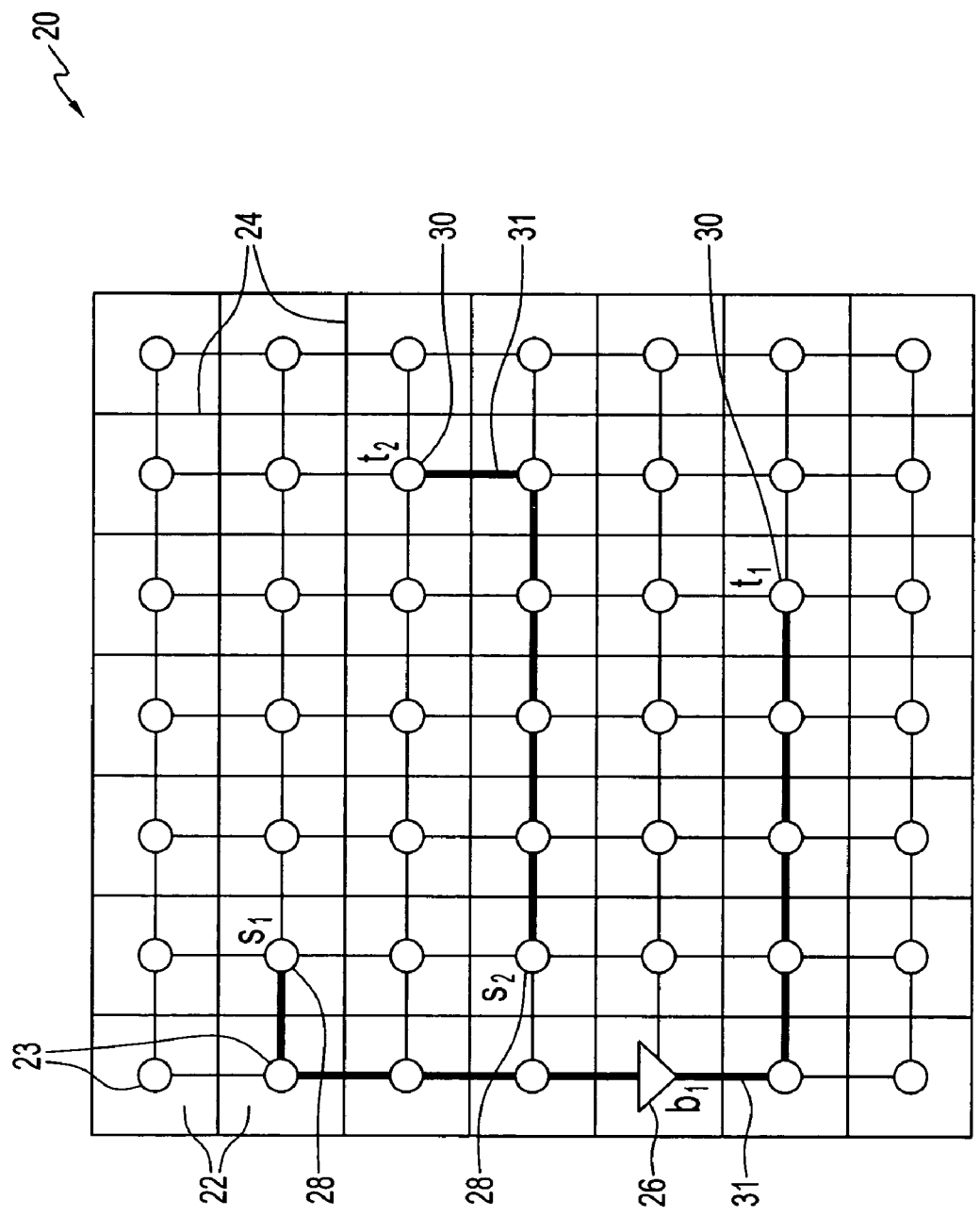
FIG. 2A is a tile diagram of an IC floorplan.
Figure 2B:
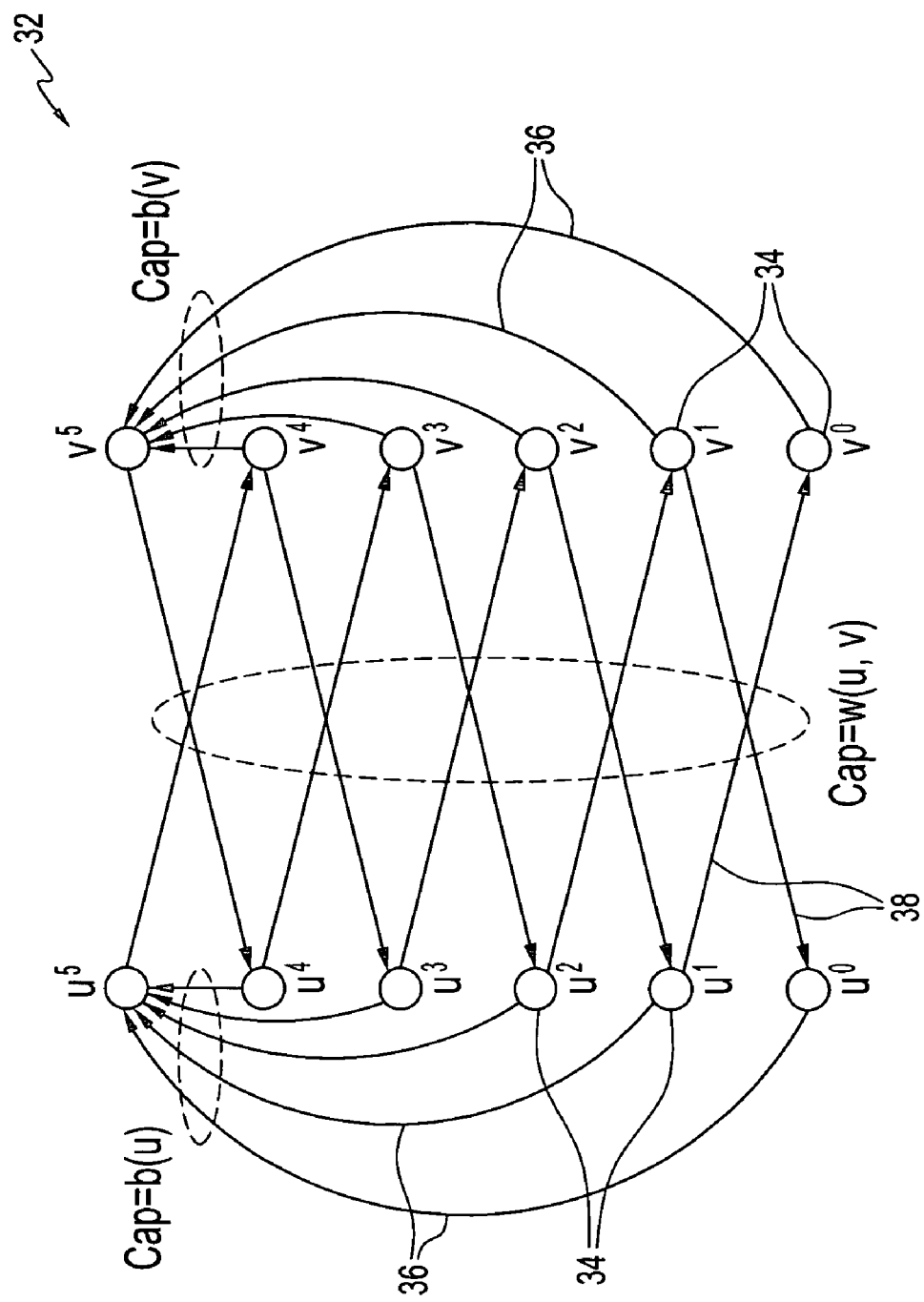
FIG. 2B is part of a gadget graph that corresponds to the tile diagram of FIG. 2A.

FIGS. 2A and 2B show the two graphical stages of one embodiment of the invention that are required to obtain the graphical representation of step 12 of FIG. 1. For purposes of simplifying the presentation, the following discussion of FIGS. 2A and 2B is based on a number of assumptions that are not intended to limit the scope of the invention in any way. Skilled artisans will recognize the applicability of the discussion to circumstances in which the assumptions do not apply. This discussion of FIGS. 2A and 2B ignores pin assignment flexibility; assumes that there is a single non-inverting buffer type and a single wire width; assumes that only buffer wireload constraints must be satisfied (i.e., that delay upper bounds will be ignored); and assumes that each net has only two pins.

FIG. 2A shows a tile graph 20. The tile graph 20 is a tile graph $G=(V, E, b, w)$, $b: \rightarrow N$, $w: E \rightarrow N$, where V is the set of tiles 22; each vertex 23 corresponds to a tile 22; E is the set of edges 24 between any two adjacent tile 22; for each tile 22 $v \in V$, the buffer capacity $b(v)$ is the number of buffer sites 26 located in v; and for each edge 24 $e=(u, v) \in E$, the wire capacity $w(e)$ is the number of routing channels available between tiles 22 u and v. We denote by $N=\{N_1, N_2, \ldots, N_k\}$ the given netlist, where each net $N_i$ is specified by a source 28 $s_i$ and a sink 30 $t_i$.

FIG. 2A shows the tile graph 20, including two exemplary tiles 22, two exemplary vertices 23 corresponding to two tiles 22, one exemplary edge 24, a buffer site 26, two sources 28, and two sinks 30. Two paths 31 are shown connecting sources 28 and sinks 30 (see the emphasized lines connecting source 28 $s_1$ to sink 30 $t_1$ and source 28 $s_2$ to sink 30 $t_2$).

A feasible buffered solution to the floorplan evaluation problem formulated from the tile graph 20 seeks for each net $N_i$ an $s_i$-$t_i$ path $P_i$ buffered using the available buffer sites 26 such that the source 28 and the buffers drive at most U units of wire, where U is a given upper-bound. In the tile graph 20 of FIG. 2A, U=5. Formally, a feasible buffered routing for net $N_i$ is a path $P_i=(v_0, v_1, \ldots, v_{l_i})$ in the tile graph 20 G together with a set of buffers $B_i \subseteq \{v_0, v_1, \ldots, v_{l_i}\}$ such that $v_0=s_i$ and $v_{l_i}=t_i$; $w(v_{i-1}, v_i) \geq 1$ for every $i=1, \ldots l_i$; $b(v_i) \geq 1$ for every $v_i \in B_i$; and the length $P_i$ between $v_0$ and the first buffer in $B_i$, between consecutive buffers, and between the last buffer and $v_{l_i}$, are each at most U.

The set of all feasible routings $(P_i, B_i)$ for net $N_i$ is denoted by $R_i$. Given buffered routings $(P_i, B_i) \in R_i$ for each $N_i$, the relative buffer congestion is $$\mu = \max_{v \in V} \frac{|\{i: v \in B_i\}|}{b(v)}$$

and the relative wire congestion is $$v = \max_{e \in E} \frac{|\{i: e \in P_i\}|}{w(e)}.$$

The buffered paths $(P_i, B_i)$, $i=1, \ldots, k$, are simultaneously routable if and only if both $\mu \leq 1$ and $v \leq 1$. To leave resources available for subsequent optimization of critical nets and engineering change order ("ECO") routing, simultaneous buffered routings and wire congestion bounded away from 1 is generally sought.

Using the total wire and buffer area as a measure of floorplan quality, the tile graph yields this floorplan evaluation problem:

Given:

tile graph $G=(V, E, b, w)$, with buffer and wire capacities $b: V \rightarrow N$, respectively $w: E \rightarrow N$;

set $N=\{N_1, \ldots, N_k\}$ of 2-pin nets with unassigned source and sink pins $S_i$, $T_i \subseteq V$; and wireload, buffer congestion, and wire congestion upper-bounds $U>0$, $\mu_0 \leq 1$, and $v_0 \leq 1$.

Find: feasible buffer routing $(P_i, B_i)$ for each net $N_i$ with relative buffer congestion $\mu \leq \mu_0$ and relative wire congestion $v \leq v_0$, minimizing the total wire and buffer area, i.e., $$\alpha \sum_{i=1}^{k} |B_i| + \beta \sum_{i=1}^{k} |P_i|$$

where $\alpha$, $\beta \geq 0$ are given constants.

FIG. 2B shows a part of a gadget graph 32 H. The part of a gadget graph 32 H is based on a single edge 24 between two tiles 22, tile 22 u and tile 22 v. (A complete gadget graph would be based on all of the edges 24 of the tile graph 20.) The part of gadget graph 32 H shown in FIG. 2B is referred to hereafter in the discussion as "gadget graph 32 H."

The gadget graph 32 H has U+1 vertex copies $v^0$, $v^1, \ldots v^U$ for each tile $v \in V(G)$. Four exemplary vertex copies 34 are indicated in FIG. 2B. The index of each vertex copy 34 corresponds to the remaining wireload budget, i.e., the number of units of wire that can still be driven by the last inserted buffer (or by a source 22). Buffer insertions are represented in the gadget graph 32 H by directed arcs 36 of the form $(v^j, v^U)$. Following such a directed arc resets the remaining wireload budget up to the maximum value of U. Each edge 24 in the tile graph 20 G gives rise to directed arcs 38 $(u^j, v^{j-1})$ and $(v^j, u^j-1)$, $j=1 \ldots U$, in the gadget graph 32 H. The copy number decreases by one for each of these directed arcs 38, i.e., j to j−1, corresponding to a decrease of one unit in the remaining wireload budget. Individual vertices $s_1$, $s_2$, $t_1$, and $t_2$ (not shown) are added to the gadget graph 32 H to represent sources 28 and sinks 30. Each source vertex (not shown) is connected by a directed arc (not shown) to the U-th vertex copy 34 representing the tile 22 that encloses the source 28 represented by the source vertex. All vertex copies 34 representing enclosing tiles 22 are connected by directed arcs (not shown) into the respective sink vertices (not shown).

Formally, the gadget graph 32 H has vertex set $$V(H)=\{s_i, t_i | 1 \leq i \leq k\} \cup \{v_j | v \in V(G), 1 \leq j \leq U\}$$

and arc set $$E(H) = E_{src} \cup E_{sink} \cup \left(\bigcup_{(u,v)\in E(G)} E_{u,v}\right) \cup \left(\bigcup_{v\in V(G)} E_v\right)$$

where $E_{src} = \{(s_i, v^U) | v \in S_i, 1 \leq i \leq k\}$ $E_{sink} = \{(v_j, t_i) | v \in T_i, 0 \leq j \leq U, 1 \leq i \leq k\}$ $E_{u,v} = \{(u^{j-1}, v^j), (v^{j-1}, u^j) | 1 \leq j \leq U\}$ $E_v = \{(v^j, v^U) | 1 \leq j \leq U\}$.

Each directed path in the gadget graph 32 H corresponds to a buffered routing in the tile graph 20 G, obtained by ignoring copy indices for the vertex copies 34 and replacing each directed arc 36 $(v^j, v^U)$ with a buffer inserted in the tile 22 v. The construction ensures that the wireload of each buffer is at most U since a directed path in gadget graph 32 H can visit at most U vertex copies 34 before following a directed buffer arc 36.

In FIG. 2B, b(u) and b(v) refer to the maximum number of buffers tiles u and v are capable of holding. The expression w(u, v) refers to the maximum number of wires that may cross the edge 24 (see FIG. 2A) between tile 22 u and tile 22 v.

There is a one-to-one correspondence between the feasible buffered routings for net $N_i$ in the tile graph 20 G and the $s_i$-$t_i$ paths in gadget graph 32 H (lemma 1).

In an embodiment of the invention, the correspondence established in lemma 1 is used to give an integer linear program ("ILP") formulation for the floorplan evaluation problem. Let $P_i$ denote the set of all simple $s_i$-$t_i$ paths in the gadget graph 32 H. The 0/1 variable $x_p$ is introduced for every path $p \in P := \cup_{1}^{k} P_i$. The variable $x_p$ is set to 1 if the buffered routing corresponding to $p \in P_i$ is used to connect net $N_i$ and to 0 otherwise. With this notation, the floorplan evaluation problem can be formulated as this ILP:

$$\min \sum_{p \in P} \left(\alpha \sum_{v \in V(G)} |p \cap E_v| + \beta \sum_{(u,v) \in E(G)} |p \cap E_{u,v}|\right) x_p$$

subject to $$\sum_{p \in P} |p \cap E_v| x_p \leq \mu_0 b(v), \quad v \in V(G);$$

$$\sum_{p \in P} |p \cap E_{u,v}| x_p \leq v_0 w(u, v), \quad (u, v) \in E(G);$$

$$\sum_{p \in P_i} x_p = 1, \quad i = 1, \ldots, k; \text{ and}$$

$$x_p \in \{0, 1\}, \quad p \in P.$$

Solving the ILP is NP-hard (where "NP" means "nondeterministic polynomial time"). A preferred embodiment of the invention solves exactly or approximately a fractional relaxation of the ILP (obtained by replacing the constraints $x_p \in \{0, 1\}$, with $x_p > 0$) and then obtains near-optimal integer solutions by randomized rounding.

An embodiment of the invention uses an efficient approximation for solving the fractional relaxation of the ILP. An upper bound D is introduced on the total wire and buffer area and the following linear program (LP) is considered:

min λ subject to $$\sum_{p \in P} \left(\alpha \sum_{v \in V(G)} |p \cap E_v| + \beta \sum_{(u,v) \in E(G)} |p \cap E_{u,v}|\right) x_p \leq \lambda D;$$

$$\sum_{p \in P} |p \cap E_v| x_p \leq \lambda \mu_0 b(v), \quad v \in V(G);$$

$$\sum_{p \in P} |p \cap E_{u,v}| x_p \leq \lambda v_0 w(u, v), \quad (u, v) \in E(G);$$

$$\sum_{p \in P_i} x_p = 1, \quad i = 1, \ldots, k; \text{ and}$$

$$x_p \geq 0, \quad p \in P.$$

Let λ* be the optimum objective value for the LP. Solving the fractional relaxation of the ILP is equivalent to finding the minimum D for which λ* ≤ 1. This can be done in a binary search that requires solving the LP for each probed value of D. A lower bound on the optimal value of D can be derived by ignoring all buffer and wire capacity constraints, i.e., by computing for each net $N_i$ buffered paths $p \in P_i$ minimizing $$\alpha \sum_{v \in V(G)} |p \cap E_v| + \beta \sum_{(u,v) \in E(G)} |p \cap E_{u,v}|.$$

A trivial upper bound is the total routing area available, i.e., $$D_{max} = \alpha \mu_0 \sum_{v \in V(G)} b(v) + \beta v_0 \sum_{(u,v) \in E(G)} w(u, v).$$

Unfeasibility in the fractional relaxation of the ILP is equivalent to λ* being greater than 1 when $D=D_{max}$, and can therefore be detected using the algorithm described below.

FIG. 3 shows a preferred algorithm for approximating the optimum solution for the LP. This algorithm uses a known general framework for multicommodity flow approximation combined with ideas similar to known ideas for efficiently handing set capacity constraints, and relies on simultaneously approximating the dual linear program ("DLP"):

$$\max \sum_{i=1}^{k} l_i$$

subject to $$\sum_{v \in V(G)} \mu_0 b(v) y_v + \sum_{(u,v) \in E(G)} v_0 w(u, v) z_{u,v} + Du = 1;$$

-continued $$\sum_{v=V(G)} |p \cap E_v|(y_v + \alpha u) + \sum_{(u,v) \in E(G)} |p \cap E_{u,v}|(z_{u,v} + \beta u) \geq l_i, \ p \in P_i;$$

$$y_v \geq 0, \ v \in V(G); \text{ and}$$

$$z_e \geq 0, \ e \in E(G).$$

The algorithm of FIG. 3 starts with trivial solutions for the LP and the DLP, and then updates the solutions over several phases. In each phase, (lines 5–16 of FIG. 3) one unit of flow is routed for each commodity; a feasible solution to the LP is obtained in line 17 of the algorithm of FIG. 3 after dividing all path flows by the number of phases. Commodities are routed along paths with minimum weight with respect to weights of $y_v + \alpha u$ for arcs in $E_v$, $v \in V(G)$, of $z_{v,u} + \beta u$ for arcs in $E_{u,v}$, $(u, v) \in E(G)$, and of 0 for all the other arcs. The dual variables are increased by a multiplicative factor for all vertices and edges on a routed path. This ensures that dual weights increase exponentially with usage and thus often-used edges are subsequently avoided.

Minimum-weight paths are computed in line 11 of the algorithm of FIG. 3, using Dijkstra's single-source shortest path algorithm. To reduce the number of shortest path computations, paths are recomputed only when their weight increases by a factor of more than $(1+\gamma\epsilon)$ (see the test in line 9 of the algorithm of FIG. 3). This known speed-up idea has been shown in the prior art to decrease running time in practice while maintaining the same theoretical worst-case runtime.

The algorithm of FIG. 3 finds an $(1+\epsilon_0)$-approximation with $$O\left(\frac{1}{\epsilon_0^2 \lambda^*} k \log n\right)$$

minimum-weight path computations, using $$\varepsilon = \min\left\{\frac{1}{\gamma}, \frac{1}{\gamma}(\sqrt{1+\varepsilon_0} - 1), \frac{1}{4}\left(1 - \left(\frac{1}{1+e_0}\right)^{\frac{1}{6}}\right)\right\}$$

and $$\partial = \left(\frac{1-\varepsilon'}{n+m}\right)^{\frac{1}{\varepsilon}}$$

where n is the number of tiles 22 or vertices 23 and m is the number of edges 24 of tile graph 20 G, respectively, and $$\epsilon' := \epsilon(1+\epsilon)(1+\epsilon\gamma).$$

In an embodiment of the invention, after the LP is solved using the algorithm of FIG. 3, the fractional flows of the solution are converted to feasible buffered routings for each net. Each net $N_i$ is routed using a randomized rounding technique. A preferred randomized rounding technique is found in P. Raghavan and C. D. Thomson, "Randomized rounding," *Combinatorica*, 7 (1987), pp. 365–374, which is incorporated in its entirety by reference herein. Using this preferred randomized rounding technique, each net $N_i$ is routed by randomly choosing one of the paths $p \in P_i$, where the probability of choosing path p is equal to the fractional flow $x_p$. Since the fractional flows satisfy buffer and wire congestion constraints, it is known that randomized rounding guarantees that, for large enough capacities, the relative congestion increases only by a small amount.

A direct implementation of randomized rounding requires storing explicitly all paths with non-zero flow. However, this may be unfeasible in the case of limited memory capacity. An alternative to storing explicitly all paths with non-zero flow is to compute edge flows instead of path flows with the algorithm of FIG. 3, then to implement randomized rounding by performing a random walk between the net source and the net sink of each net. (Performing the random walk backwards, from net sinks to net sources, leads to reduced congestion for the case when a significant number of 2-pin nets results from the decomposition of multipin nets.)

An embodiment of the invention makes use of another implementation requiring storing a single path per net, in which randomized rounding is interleaved with computation of the fractional flows $x_p$. The path selected for each net is continuously updated as follows. In the first phase, the single path routed for each net becomes the net's choice with probability 1. In iteration $r > 1$, the path routed for net i replaces the previous selection of net I with a probability of $(r-1)/r$. The path selected after t phases was selected by the net in phase $r = 1, \ldots, t$ with an equal probability of $1/r$, i.e., the probability that a path p is the final selection is equal to the fractional flow $x_p$ computed by the algorithm of FIG. 3.

In an embodiment of the invention, the paths routed for each net in the last $K=5$ phases of the algorithm of FIG. 3 are saved. The K paths resulting for each net need not be distinct. Then, one of the saved K paths is picked for each net, uniformly at random. The results can be further improved in an embodiment of the invention by repeating the random choices a large number (e.g., 10,000) of times and keeping the choices that resulting in the smallest congestion or routing area, depending on the optimization criteria.

In an embodiment of the invention, dependence on $\lambda^*$ of the algorithm of FIG. 3 finding $(1+\epsilon_0)$-approximation may be eliminated by a scaling technique. A preferred technique is described in L. K. Fleischer, "Approximating fractional multicommodity flow independent of the number of commodities," *SIAM J. Discrete Math.* 13 (2000), pp. 505–520. Thus, using a Fibonacci heap implementation of Dijkstra's algorithm to compute minimum-weight paths leads to a runtime of $O(k(m+n \log n) (\log n)/\epsilon_0^2)$ for the algorithm of FIG. 3.

Using known ideas, it can be shown that the algorithm of FIG. 3 not only minimizes $\lambda$, but also "strives" for a lexicographically minimum solution with respect to the vector consisting of the relative buffer congestion of the vertices, the relative wire congestion of the edges, and the ratio between the total routing area and the upper-bound D. Therefore, a solution of the algorithm of FIG. 3 indicates where possible changes to the IC floorplan have to be made in order to reach a feasible routing of all nets. For this it is especially useful to run the algorithm with a large value for D, that is, to relax the constraint on the total wire and buffer area. If this constraint is to be ignored completely, (i.e., by setting $D=\infty$), the dual variable u is zero throughout the whole execution of the algorithm of FIG. 3 and can thus be eliminated.

In an embodiment of the invention, line 2 of the algorithm of FIG. 3, which requires setting to zero an exponential number of variables, is not implemented explicitly. In this embodiment, the algorithm keeps track only of the paths with non-zero flow, i.e., those paths for which flow is augmented in line 13 of the algorithm of FIG. 3.

To evaluate a floorplan at an early stage of the design process, it is useful not only to find the minimum routing area need for given bounds on $\mu_0$ and $v_0$ on the relative buffer and wire congestion, but also to find how the total routing area increases if a smaller congestion is enforced. A floorplan is better if a smaller area increase is needed for the same decrease in congestion. Let the minimum routing area needed for a fractional solution with relative buffer and wire congestion not more than $\mu$ and $v$, respectively, be denoted by $\Lambda(\mu, v)$. In the following, a vector x denotes the fractional solution $x_p$, p∈P for the LP. Letting $A(x)$, $\mu(x)$ and $v(x)$ denote the total routing area, buffer congestion, and wire congestion of x, respectively. A lemma states that the function $(\mu, v) \rightarrow \Lambda(\mu, v)$ is convex (lemma 2).

Another lemma shows that in certain cases a value $\Lambda(\mu, v)$ can be derived from an optimal solution of the LP, so the binary search described above can be avoided: letting x be an optimal solution for the LP for a given D, $\mu_0$, and $v_0$, if there exists a solution x' with $$\max\left(\frac{\mu(z')}{\mu_0}, \frac{v(z')}{v_0}\right) < \max\left(\frac{\mu(z)}{\mu_0}, \frac{v(z)}{v_0}\right)$$

then $\Lambda(\mu(x), v(x))=A(x)$ (lemma 3).

In an embodiment of the invention, the full area versus the congestion tradeoff curve is computed as follows. The feasible region (which is also convex) for $\mu$ and $v$ is computed by ignoring the constraint on the area. The LP is then solved for certain values of D, $\mu_0$ and $v_0$. If the solution is on the boundary of the feasible region, D is decreased such that $\mu$ and $v$ increase; otherwise, a new point for the area and congestion tradeoff curve has been found.

Embodiments of the invention using the algorithm of FIG. 3 and the randomized rounding described above can be used to handle pin assignment, polarity constraint imposed by the use of inverting buffers, buffer and wire sizing, and prescribed delay upper-bounds (but not multipin nets) with changes to the gadget graph 32 H.

There is a considerable degree of flexibility available for pin assignment at the early stage of floorplan design. In an embodiment of the invention, consideration of floorplan design requires only two small changes in the construction of the gadget graph 32 H. First, source vertices $s_i$ must now be connected by directed arcs to the U-th copies of all vertices 23 representing enclosing tiles 22. Second, copies 0, . . . , U of all nodes representing enclosing tiles 22 must be connected by directed arcs into the sink vertices $t_i$. Pin assignments are read from the paths selected by randomized rounding by assigning to each source an arbitrary pin in the tile 22 visited first, or each sink an arbitrary pin in the tile 22 visited last, by the selected path for the net. This embodiment of the invention does not distinguish between multiple pin assignments within a tile, since the within-tile pin assignment has no effect on tile-level congestion and routing area estimates. The size of the gadget graph 32 H in this embodiment is virtually of the same size as the gadget graph 32 H. For k nets, only O(k) edges are added to the gadget graph 32 H under the realistic assumption that each pin can be assigned to at most O(1) tiles. Therefore, the time required to find minimum-weight paths, and hence the overall runtime of the algorithm of FIG. 3, does not increase even though the number of paths available for each net increases when considering pin assignment.

The present invention also permits consideration of given sink delay constraints. For simplicity, an embodiment of the invention that deals with sink delay constraints assuming only a single buffer type and a single wire size are available is first discussed, with no intention of limiting the invention in any way. Then, an embodiment of the invention that may simultaneously handle buffer and wire sizing is discussed.

Assume an upper-bound of $d_i$ on the source 22-to-sink 24 delay of net $N_i$. The delay of a wire segment connecting the source 22 or buffer u to the sink 24 or buffer v is the sum between the gate delay $$\text{intrinsic\_delay}_u + r_u \cdot (c_w l_{u,v} + C_{in}(v))$$

and the wire delay $$r_w l_{u,v} \cdot (c_w l_{u,v}/2 + C_{in}(v))$$

where $r_u$ and $C_{in}(v)$ are the output resistance and input capacitance, respectively, of the buffer/terminal u; $r_w$ and $c_w$ are the resistance and capacitance, respectively, of a tile-long wire; and $l_{u,v}$ is the wire length in tiles between u and v. Here, the term "gate" encompasses sources, sinks, and buffers, and the term "terminal" encompasses sources 22 and sinks 24.

To simplify the description of this embodiment of the invention even more, again without limiting the scope of the invention, it is assumed that the intrinsic delay and output resistance of sources are equal to the corresponding parameters of a buffer. (Non-uniform parameters are discussed below.) Under this assumption the total (i.e., gate+wire delay) delay of each routing segment depends only on the segment's length, l, and the input capacitance of the driven buffer/sink. Every routing segment ending in tile 22 v corresponds in the gadget graph 32 H to a path whose last directed arc is either the directed arc 36 ($v^1$, $v^0$), if the segment drives a buffer, or the directed arc ($v^l$, $t_i$), if the segment drives the i-th sink. Since these directed arcs fully identify both the segment length and the input capacitance of the driven buffer/sink, we can assign them pre-computed segment delays and obtain this lemma (lemma 4): the one-to-one correspondence between feasible buffered routings of net $N_i$ in tile graph 20 G and the $s_i$-$t_i$ paths in gadget graph 32 H preserves the delay.

If given an upper-bound of $d_i$ on the source 22-to-sink 24 delay of net $N_i$, computation of the solution by use of the algorithm of FIG. 3 must be restricted to paths p∈$P_i$ that have path time delay at most $d_i$. Although the problem of finding a least-weight $s_i$-$t_i$ path is NP-hard, there is a preferred algorithm with an arbitrarily good approximation guarantee, i.e., a fully polynomial approximation scheme that suffices for obtaining good approximations to the timing-driven floorplan evaluation problem, given in C. A. Philips, "The network prohibition problem," *Proc. 25th Annual ACM Symposium on Theory of Computing*, 1993, pp. 776–785, which is incorporated in its entirety by reference herein.

An embodiment of the invention uses modifications of the gadget graph 32 H described above to handle sink delay constraints. This embodiment, in general, applies for any delay model, such as the Elmore delay model for which (1) the delay of a buffered path is the sum of the delays of the path segments separated by the buffers, and (2) the delay of each segment depends only on segment length and buffer parameters. (This embodiment does not take into account the slope at the input of the driving buffer, but this is not a significant problem in the context of early floorplan evaluation.) For efficiency, this embodiment requires that segment delays be rounded to relatively coarse units.

Figure 4:
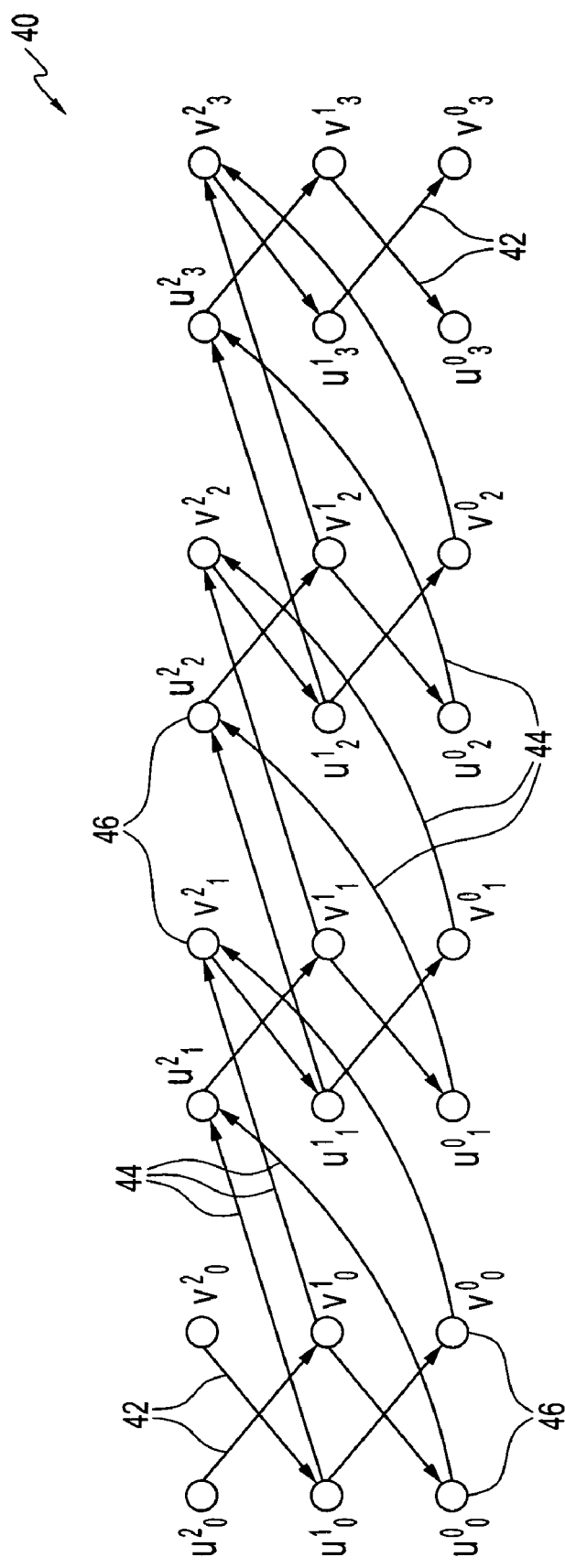
FIG. 4 is a part of a gadget graph representing delay constraints.

FIG. 4 shows the part of a gadget graph 40 H for the case when the delay is measured simply by the number of inserted buffers. This embodiment of the invention replicates the basic gadget graph 32 H, a number of times equal to the maximum allowed net delay. Within each replica, tile-to-tile directed arcs 42 decrease remaining wireload budget by one unit. To keep track of path delays, the directed arcs 44 advance over a number of gadget graph replicas equal to the delay of the wire segment ended by the respective buffer. (This delay can easily be determined for each buffer arc since the tail of the directed arc 44 fully identifies the length of the wire segment.) The construction is completed by connecting with directed arcs (not shown) net sources (not shown) to the vertices 46 with maximum remaining wireload budget in the "zero delay" replica of the gadget graph 40 H, and adding directed arcs (not shown) into the net sinks (not shown) from all the vertices 46 in replicas corresponding to delays smaller than the given delay upper-bounds.

The resulting gadget graph 40 H in this embodiment of the invention is acyclic, so minimum-weight paths in the approximation algorithm of FIG. 3 may be computed by computing the distances from the net source (not shown) via a topological traversal of the graph in O(m+n) time instead of the O(m+n log n) time needed by Dijkstra's single-source shortest-path algorithm.

An embodiment of the invention also takes into account buffer and wire sizing during timing-driven IC floorplan evaluation. Looking first at the case of using a given buffer library B of buffers of different types and a fixed wire width, each buffer type has a given area, input capacitance, and output resistance, and the different upper-bounds U on the wirelength that can be driven by each buffer type. A gadget graph $H^B$ capturing all feasible buffered routings with buffers from B may be obtained by constructing a delay-weighted gadget graph H for each buffer type, with the same source vertices $s_i$ and sink vertices $t_i$, i=1, ..., k, and with the same vertices $v^0$ for every v∈V(G), then removing from the gadget graph $H^B$ all directed arcs of the form $(s_i, v^0)$, except the directed arc corresponding to the buffer whose driving strength is closest to that of source $s_i$. The gadget graph $H^B$ so constructed may then be used, in this embodiment of the invention, to formulate an integer linear program that may be solved for an integer solution, and the integer solution converted into feasible buffered routings.

In another embodiment of the invention, wire sizing may be taken into account. To reduce the complexity of the problem, fixed wired widths are required along any source-to-buffer wire segment, any buffer-to-buffer wire segment and any buffer-to-sink wire segment, a requirement that may increase propagation delays by at most 5% compared to the optimum delay achieved by wire tapering. Given a library of wires of different widths W, a gadget graph $H^{B \times W}$ capturing all feasible routings with buffers from the library B and with wire widths from the library W may be obtained by constructing a gadget graph $H^B$ as discussed above for each wire width represented in the library W, with the same source vertices $s_i$ and sink vertices $t_i$, i=1, ..., k, and with the same vertices $v^0$ for every tile v∈V(G). There is a delay-preserving one-to-one correspondence between buffer- and wire-sized feasible routings of net $N_i$ in tile graph G and the $s_i$-$t_i$ paths in the gadget graph $H^{B \times W}$ (lemma 5), so the algorithm of FIG. 3 may be used to solve an integer linear program formulated from the gadget graph $H^{B \times W}$, using the same fully polynomial approximation scheme that suffices for obtaining good approximations to the timing-driven floorplan evaluation problem.

Figure 5A:
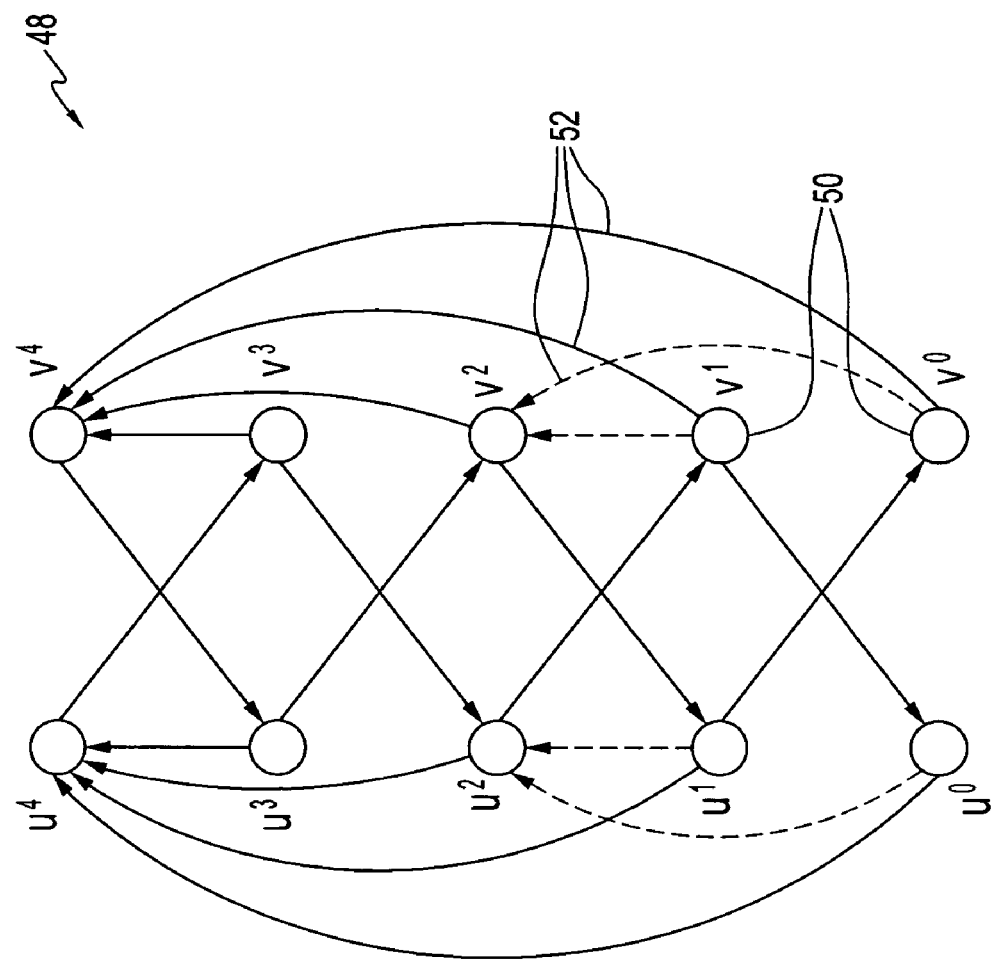
FIG. 5A is a part of a gadget graph representing different buffer sizes.

An embodiment of the invention incorporates buffer and wire sizing through modifications of the gadget graph 32 H. A gadget graph 48 H for buffer sizing is shown in FIG. 5A for two available buffer sizes, one with wireload upper-bound U=4, and one with wireload upper-bound U=2. The general construction entails using a number of vertex copies 50 of each vertex equal to the maximum buffer load upper-bound U. For every buffer with wireload upper-bound of U'≦U, buffer arcs $(v^i, v^{U'})$ are inserted for every 0≦i≦U'. Thus, the copy number of each vertex copy 50 continues to capture the remaining wireload budget, which ensures the correctness of the gadget graph 48 H.

Figure 5B:
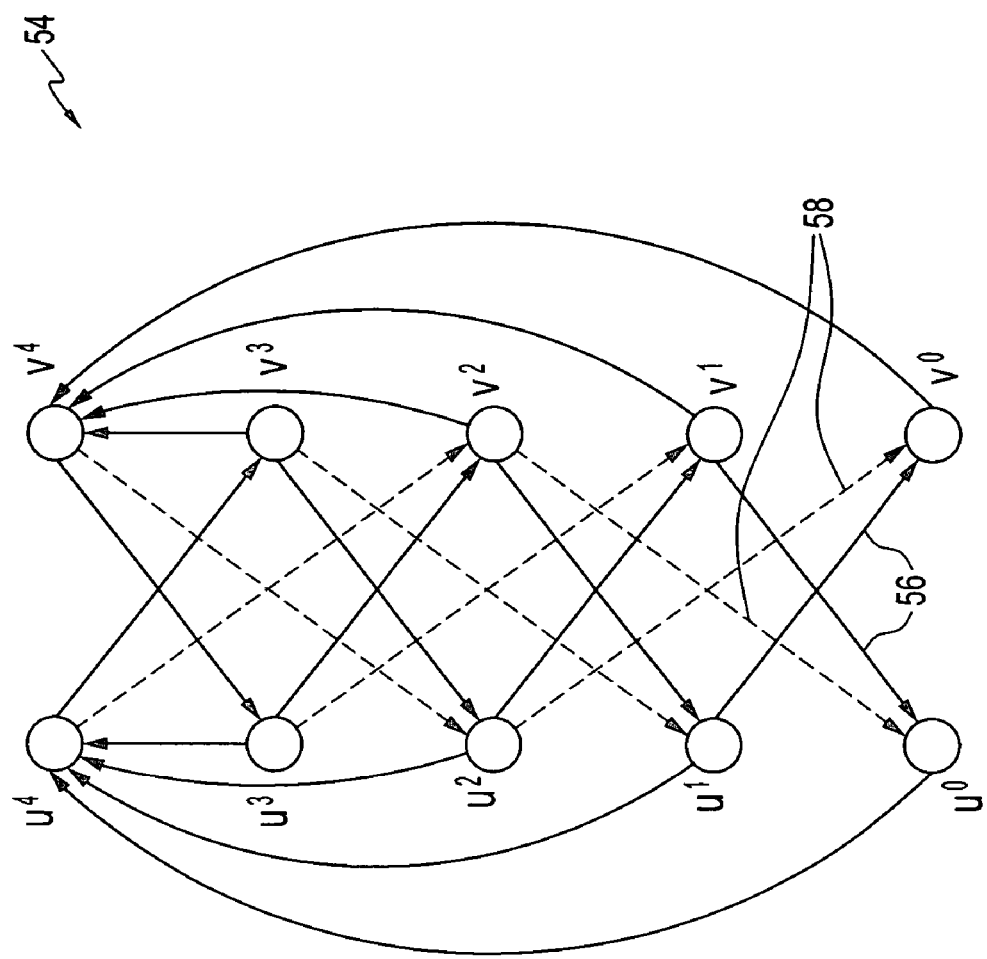
FIG. 5B is a part of a gadget graph representing different wire sizes.

An embodiment of the invention handles wire sizing (and a coarse form of layer assignment) by a different modification of the gadget graph 32 H. Assuming that per unit capacitances of the thinner wire widths are rounded to integer multiples of the "standard" per unit capacitance, the gadget graph 54, shown in FIG. 5B, models the use of thinner segments of wire by providing directed arcs 56 and 58 from tile to tile which decrease the tile copy index (i.e., remaining wireload budget) by more than one unit. For example, solid directed arcs 56 $(u^i, v^{i-1})$ and $(v^i, u^{i-1})$ correspond to standard width connections between tiles u and v, with dashed directed arcs 58 $(u^i, v^{i-2})$ and $(v^i, u^{i-2})$ corresponding to "half-width" connections, i.e., connections using wire with double capacitive load per unit.

Inverting buffers are often preferred to non-inverting type buffers since they occupy a smaller areas for the same driving strength. The use of inverting buffers introduces additional polarity constraints, which requires a larger number of buffers to be inserted, but overall, inverting buffers may lead to a better overall resource utilization. Algorithms for bounded capacitive load inverting and non-inverting buffer insertion are known; the prior art focuses on single net buffering with arbitrary positions for the buffers. But in the floorplan evaluation problem, the goal is to minimize the overall number of buffers required by the nets, and buffers can be inserted only in the available sites.

Figure 6:
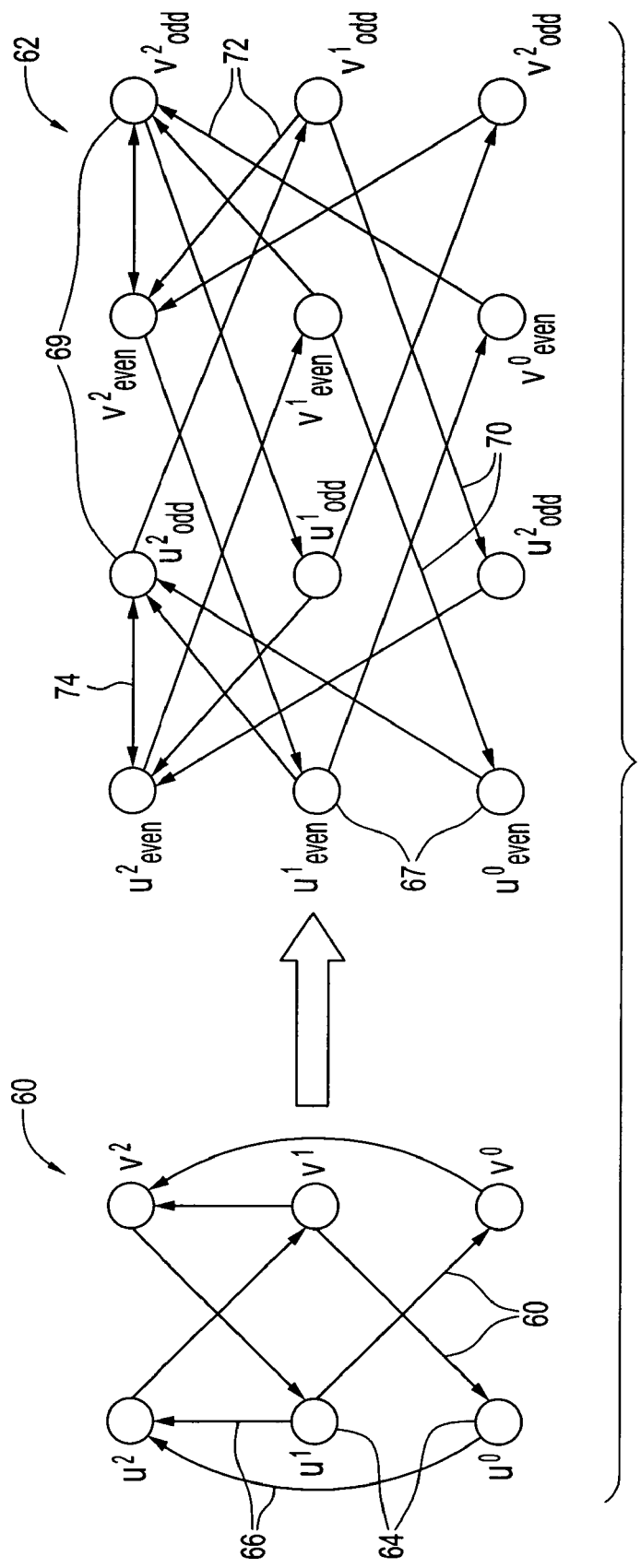
FIG. 6 is a part of a gadget graph representing polarity constraints.

In an embodiment of the invention, consideration of polarity constraints is achieved by modifying a gadget graph 32 H as shown in FIG. 6 and described as follows, resulting in modified gadget graph 62. Gadget graph 60 corresponds to gadget graph 32 H, except where gadget graph 32 H has a buffer load upper-bound of U=5, gadget graph 60 H has a buffer load upper bound of U=2. The vertex copies 64 correspond to the vertex copies 34 of FIG. 2B; the directed arcs 66 correspond to the directed arcs 36; and the directed arcs 68 correspond to the directed arcs 38.

In the modified gadget graph 62, each vertex copy 64 of the basic gadget graph 60 H is replaced by an "even" vertex copy 67 and an "odd" vertex copy 69, i.e., $v^i$ is propagated into $v^i_{even}$ and $v^i_{odd}$. Exemplary even vertex copies 67 and exemplary odd vertex copies 69 are indicated in FIG. 6. Each directed arc 68 is replaced by two directed arcs 70 connecting copies with the same polarity, e.g., the directed arc 68 $(u^i, v^{i-1})$ gives rise to directed arcs 70 $(u^i_{even}, v^{i-1}_{even})$ and $(u^i_{odd}, v^{i-1}_{odd})$. If a path uses such a directed arc 70, then it does not change polarity. Instead, each directed arc 66 changes polarity, i.e., directed arc 66 $(v^i, v^U)$ gives rise to directed arcs 72 $(v^i_{even}, v^U_{odd})$ and $(u^i_{odd}, v^U_{even})$.

The gadget graph 62 H also allows two inverting buffers to be inserted in the same tile for the purpose of meeting polarity constraints. This is achieved by providing bidirectional arcs 74 connecting the U-th even and odd copies of a tile v, i.e., $(u^U_{even}, u^U_{odd})$ and $(v^U_{odd}, u^U_{even})$. Finally, source vertices $s_i$ (not shown) are connected by directed arcs (not shown) to the even U-th vertex copy 66 representing an enclosing tile 22, and only vertex copies 67 or 69 of the desired polarity have directed arcs (not shown) going into sink vertices $t_l$ (not shown).

An embodiment of the invention provides for multipin nets: nets including more than one sink $t_i$. For multipin nets, a buffered tree, rather than a buffered path, is sought in which the wireload of each buffer is at most U. The algorithm of FIG. 3 may be extended to consider multipin nets by use of a preferred subroutine, shown in FIG. 7, that computes feasible buffered routings with respect to the dual variables $y_v$ and $z_e$. The subroutine of FIG. 7, when used to extend the algorithm of FIG. 3, is invoked at line 10 of the algorithm of FIG. 3. The subroutine shown in FIG. 7 is for consideration of three-pin nets, but the skilled artisan will readily understand how the subroutine may be applied for multipin nets with more than three pins. For purposes of the subroutine of FIG. 7, the possible locations of the source pin for a net $N_i$ are specified by $S_i$, and the possible locations of the two sinks are specified by the sets $T^1_i$ and $T^2_i$. In the gadget graph H constructed for consideration of multipin IC floorplan evaluation, there are the sink nodes $t^1_i$ and $t^2_i$ and two sets of directed arcs $\{(v^j, t^l_i)|v \epsilon T^l_i, j=0, \ldots, U\}, l=1, 2$, pointing to the sink nodes for the three-pin net. For each possible Steiner point v (enclosed by and represented by tiles vϵV), the subroutine of FIG. 7 tries all possible lengths on the path from v to $t^1_i$ and, respectively, to $t^2_i$.

Under the assumption that the driving strength of the source terminals is identical to the driving strength of a buffer, and the input capacitance of the sink terminals is identical to the input capacitance of a buffer, a feasible solution to a floorplan evaluation problem will satisfy load capacitance constraints regardless of which source terminal is driving the net. Thus, an embodiment of the invention may be used with respect to instances that contain multi-driven nets such as buses. However, application of an embodiment of the invention to multi-driven nets seems feasible only for the case in which buffers are non-inverting (i.e., there are no polarity constraints). Further, an embodiment of the invention capable of handling multipin nets cannot handle multi-driven nets with simultaneous upper-bounds on delays for paths involving more than one source.

An embodiment of the invention decreases the tile size to increase accuracy. However, this results in significant increases in running time. Furthermore, when the tile size decreases beyond a certain point, the channel widths and the number of buffer sites per tile may become so small that the accuracy of the randomized rounding is greatly reduced. Ideally, the channel widths and buffer sites per tile should be approximately the same for all tiles. If a tile is too crowded, potential congestion violations can be missed, and if a tile is too sparse, then the solution of the linear program relaxation cannot be rounded accurately. This embodiment of the invention uses uneven tile sizes to achieve evenly populated tiles, implemented by using appropriate target values for channel width and buffer sites per tile, and, starting with a coarse grid, recursively partitioning the overpopulated tiles into four equal sub-tiles until the target tile occupancy is reached.

An embodiment of the invention handles constraints, not only on the number of buffer sites in each tile, but additional constraints on the total number of buffers in a set of tiles, i.e., in a window. For instance, these additional constraints may explicitly bound the total number of buffers in a given block.

The algorithm of FIG. 3 uses a multiplicative update rule for the dual variables: in each phase the dual variable corresponding to the set of edges E' is multiplied by a factor of $(1+\epsilon x)$, where x is the ratio between the flow increase through E' and the capacity of E'. Other update rules guarantee convergence, such as the known method of updating the dual corresponding to E' by $e^{\epsilon x}$, which is more robust, i.e., guarantees convergence over a wider range of values for $\epsilon$, for a similar multicommodity flow algorithm. It will be appreciated by the skilled artisan that further improvements in runtime and solution quality may be obtained by the use of Newton's method to compute an update factor in each phase.

While various embodiments of the present invention have been shown and described, it should be understood that other modifications, substitutions, and alternatives are apparent to one of ordinary skill in the art. Such modifications, substitutions, and alternatives can be made without departing from the spirit and scope of the invention, which should be determined from the appended claims.

Various features of the present invention are set forth in the appended claims.

What is claimed is:

1. A method for evaluating a floorplan and for defining a global buffered routing for an integrated circuit, the method comprising the steps of:
   constructing a tile graph from the integrated circuit (IC) floorplan, including wire capacity and buffer capacities;
   constructing a gadget graph from said tile graph such that feasible buffered routings of every net are in one-to-one correspondence to simple paths between a net source and a net sink in said gadget graph;
   formulating an integer linear program from said gadget graph; and
   finding a solution to said integer linear program.

2. The method recited in claim 1, wherein
   said tile graph comprises a tile graph G=(V, E, b, w), b→N, W:E→N, where,
   V, a set of tiles v that represents the IC floorplan;
   E, a set of two-dimensional edges between any two of said tiles vϵV that are contiguous;
   b(v), a set of buffer capacities, each of said buffer capacities being a number of buffer sites located in each of said tiles vϵV;
   w(e), a set of wire capacities, each of said wire capacities being a number of wire routing channels across each of said edges eϵE; and
   a netlist set N of nets $N_i$ such that $N=\{N_1, N_2, \ldots, N_k\}$ to be included in the floorplan, each of said nets $N_i$ specified by sets of source tiles $S_i \epsilon V$, said source tiles $S_i$ being tiles v to which at least one net sources $s_i$ may be assigned and by sets of sink tiles $T_i \epsilon V$, said sink tiles $T_i$ being tiles v to which at least one net sink $t_i$ may be assigned.

3. The method recited in claim 2, further comprising:
   formulating a floorplan evaluation problem from said tile graph G, said floorplan evaluation problem including
      a statement of what is given, said given statement including
         said tile graph G;
         said netlist N;
         a wireload upper-bound of U>0;
         a buffer congestion upper-bound of $\mu_o$# 1; and
         a wire congestion upper-bound of $v_0$# 1; and
      a statement of what is to be found, said find statement including
         feasible buffered routings $(P_i, B_i)$, among a set $R_i$ of all feasible buffered routings $(P_i, B_i)$, for each of said nets $N_i$, each of said feasible buffered routings $(P_i, B_i)$ including
            a path $P_i=(v_0, v_1, \ldots, v_{li})$ in said tile graph C and a set of buffers $B_i \subseteq \{v_0, \ldots, v_{li}\}$ such that
            tile $v_0 \epsilon S_i$;
            tile $v_{li} \epsilon T_i$;

buffer capacity $b(v_i) \ge 1$ for every tile $v_i \in B_i$;

a length along said path $P_i$ between tile $v_0$ and a first buffer in $B_i$ has at most said wireload upper-bound U;

a length between consecutive buffers in $B_i$ has at most said wireload upper-bound U; and a length between a last buffer in $B_i$ and tile $v_{ji}$ has at most said wireload upper-bound U; and wherein each of said feasible buffered routings $(P_i, B_i)$ has a relative buffer congestion of $\mu \# \mu_0$, wherein said relative buffer congestion $$\mu = \max_{v \in V} \frac{|\{i : v \in B_i\}|}{b(v)};$$

has a relative wire congestion of $v \# v_0$, wherein said relative wire congestion $$v = \max_{e \in E} \frac{|\{i : e \in P_i\}|}{w(e)};$$

and minimizes a total wire and buffer area.

4. The method recited in claim 3, wherein said a gadget graph comprises a gadget graph H, said gadget graph H being constructed from said tile graph G and includes a vertex set $V(H) = \{s_i, t_i | 1 \# i \# k\} \cup \{v_j | v \in V(G), 1 \# j \# U\}$; and a directed arc set E(H) including directed arc set $E_{src} = \{(s_i, v^U) | v \in S_i, 1 \# i \# k\}$;

directed arc set $E_{sink} = \{(v_j, t_i) | v \in T_i, 0 \# j \# U, 1 \# i k\}$;

directed arc set $E_{u,v} = \{(u^{j-1}, v^j), (v^{j-1}, u^j) | 1 \# j \# U\}$; and directed arc set $E_v = \{(v^j, v^U) | 1 \# j \# U\}$, such that $$E(H) = E_{src} \cup E_{sink} \cup \left( \bigcup_{(u,v) \in E(G)} E_{u,v} \right) \cup \left( \bigcup_{v \in V(G)} E_v \right).$$

5. The method recited in claim 4, wherein said formulating said integer linear program from said gadget graph includes denoting the set of all simple paths p from said at least one net source $s_i$, to said at least one net sink $t_i$, as set $P_i$; and formulating said floorplan evaluation problem from said gadget graph as said integer linear program $$\min \sum_{p=P} \left( \alpha \sum_{v \in V(G)} |p \cap E_v| + \beta \sum_{(u,v) \in E(G)} |p \cap E_{u,v}| \right) x_p,$$

said integer linear program being subject to $$\sum_{p \in P} |p \cap E_v| x_p \le \mu_0 b(v), \quad v \in V(G);$$

$$\sum_{p \in P} |p \cap E_{u,v}| x_p \le v_0 w(u, v), \quad (u, v) \in E(G);$$

$$\sum_{p \in P_i} x_p = 1, \quad i = 1, \ldots, k; \text{ and}$$

$$x_p \in \{0, 1\}, \quad p \in P.$$

6. The method recited in claim 5, wherein said finding said solution to said integer linear program includes introducing an upper-bound D on said total wire and buffer area;

formulating a linear program (min $\lambda$), said linear program (min $\lambda$) being subject to $$\sum_{p=P} \left( \alpha \sum_{v \in V(G)} |p \cap E_v| + \beta \sum_{(u,v) \in E(G)} |p \cap E_{u,v}| \right) x_p \le \lambda D;$$

$$\sum_{p \in P} |p \cap E_v| x_p \le \lambda \mu_0 b(v), \quad v \in V(G);$$

$$\sum_{p \in P} |p \cap E_{u,v}| x_p \le \lambda v_0 w(u, v), \quad (u, v) \in E(G);$$

$$\sum_{p \in P_i} x_p = 1, \quad i = 1, \ldots, k; \text{ and}$$

$$x_p \ge 0, \quad p \in P; \text{ and}$$

finding a minimum upper-bound D for which an optimum objective value for said linear program (min $\lambda$)$\lambda^* \# 1$.

7. The method recited in claim 6, wherein said finding a minimum upper-bound D for which an optimum objective value for said linear program (min $\lambda$)$\lambda^* \le 1$ is performed by use of an algorithm, said algorithm simultaneously approximating said linear program (min $\lambda$) and a dual linear program $$\max \sum_{i=1}^{k} l_i,$$

said dual linear program being subject to $$\sum_{v \in V(G)} \mu_0 b(v) y_v + \sum_{(u,v) \in E(G)} v_0 w(u, v) z_{u,v} + Du = 1;$$

$$\sum_{v \in V(G)} |p \cap E_v|(y_v + \alpha u) + \sum_{(u,v) \in E(G)} |p \cap E_{u,v}|(z_{u,v} + \beta u) \ge l_i, \quad p \in P_i;$$

$$y_v \ge 0, \quad v \in V(G); \text{ and}$$

$$z_e \ge 0, \quad e \in E(G).$$

8. The method recited in claim 7, wherein said algorithm finds a $(1+\epsilon_0)$-approximation with $$O\left( \frac{1}{\epsilon_0^2 \lambda^*} k \log n \right)$$

shortest path calculations, using $$\varepsilon = \min\left\{\frac{1}{\gamma}, \frac{1}{\gamma}(\sqrt{1+\varepsilon_0} - 1), \frac{1}{4}\left(1 - \left(\frac{1}{1+e_0}\right)^{\frac{1}{6}}\right)\right\} \text{ and } \partial = \left(\frac{1-\varepsilon'}{n+m}\right)^{\frac{1}{\varepsilon}},$$

wherein n is the number of vertices of tile graph G, m is the number of said edges of tile graph G, and $\epsilon' := \epsilon(1+\epsilon)(1+\epsilon\gamma)$.

9. The method recited in claim 1, further comprising:
evaluating routing and buffer resources using said solution.

10. The method recited in claim 9, wherein
said evaluating includes computing a tradeoff curve for a total routing area, a wire congestion, and a buffer congestion.

11. The method recited in claim 1, further comprising:
defining at least one feasible buffered routing using said solution.

12. The method recited in claim 11, wherein
said defining said at least one feasible buffered routing includes randomly choosing a path from among a plurality of paths yielded by said solution.

13. The method recited in claim 1, wherein
said gadget graph includes a representation of a flexibility for assignment of pins in the floorplan.

14. The method of claim 1, wherein
said gadget graph includes a representation of polarity constraints associated with inverting buffers.

15. The method recited in claim 1, wherein
said gadget graph includes a representation of a plurality of buffer sizes.

16. The method recited in claim 1, wherein
said gadget graph includes a representation of a plurality of wire sizes.

17. The method recited in claim 1, wherein
said gadget graph includes a representation of delay constraints.

18. The method recited in claim 1, wherein
said finding a solution to said integer linear program includes finding a solution for at least one net with a single source and a single sink.

19. The method recited in claim 1, wherein
said finding a solution to said integer linear program includes finding a solution for at least one net with a single source and a plurality of sinks.

20. The method recited in claim 1, wherein
said tile graph includes tiles of a plurality of sizes.

21. The method recited in claim 1, wherein said tile graph includes a representation on constraints on a numbers of buffers in specified sets of tiles.

22. A computer-readable medium having computer-readable instructions for performing the method recited in claim 1.

23. A method for evaluating a floorplan and for defining a global buffered routing for an integrated circuit, the method comprising the steps of:

constructing a tile graph from the integrated circuit floorplan, formulating a floorplan evaluation problem from said tile graph, and constructing a gadget graph from said tile graph such that feasible buffered routings of every net are in one-to-one correspondence to paths between net source and a net sink in said gadget graph;

formulating said floorplan evaluation problem as an integer linear program from said gadget graph; and finding a solution to said integer linear program, including, finding a solution to a fractional relaxation of said integer linear program, and rounding said solution to said fractional relaxation to an integer solution using randomized rounding.

24. A computer-readable medium having computer-readable instructions for performing the method recited in claim 23.

* * * * *

UNITED STATES PATENT AND TRADEMARK OFFICE
CERTIFICATE OF CORRECTION

PATENT NO. : 7,062,743 B2
APPLICATION NO. : 10/670134
DATED : June 13, 2006
INVENTOR(S) : Kahng et al.

It is certified that error appears in the above-identified patent and that said Letters Patent is hereby corrected as shown below:

On the Title Page In the Issued Patent:

Item 56 References Cited, Other Publications, Page 2, Col. 2, line 18, after "modify flow and other", please delete "fractional packaging problems", and insert --fractional packing problems-- therefor.

Col. 3, line 14, after "representation of", please delete "step 12", and insert --step 10-- therefor.

Col. 12, line 6, please delete "$0 \leq i \leq U$' ", and insert --$0 \leq i < U$'-- therefor.

Col. 14, line 44, after "one", please delete "net sources", and insert --net source-- therefor.

Col. 14, line 64, after "said", please delete "tile graph C", and insert --tile graph G-- therefor.

Col. 15, line 27, after "said", please delete "a gadget", and insert --gadget-- therefor.

Col, 15, line 34, after "set", please delete "$E_{sink} = \{(v_j, t_i) \; v \in T_i, 0 \# j \# U, 1 \# i \; k\}$", and insert -- $E_{sink} = \{(v_j, t_i) \mid v \in T_i, 0 \# j \# U, 1 \# i \# k\}$ -- therefor.

UNITED STATES PATENT AND TRADEMARK OFFICE
CERTIFICATE OF CORRECTION

PATENT NO. : 7,062,743 B2
APPLICATION NO. : 10/670134
DATED : June 13, 2006
INVENTOR(S) : Kahng et al.

It is certified that error appears in the above-identified patent and that said Letters Patent is hereby corrected as shown below:

Col. 15, line 55, please delete "min $\sum_{p=P}(\alpha \sum_{v \in V(G)}|p \cap E_v| + \beta \sum_{(u,v) \in E(G)}|p \cap E_{u,v}|)x_p$, ", and insert --min $\sum_{p \in P}(\alpha \sum_{v \in V(G)}|p \cap E_v| + \beta \sum_{(u,v) \in E(G)}|p \cap E_{u,v}|)x_p$, -- therefor.

Signed and Sealed this

Twenty-sixth Day of February, 2008

JON W. DUDAS
*Director of the United States Patent and Trademark Office*